United States Patent
Camacho et al.

(10) Patent No.: US 8,508,026 B2
(45) Date of Patent: Aug. 13, 2013

(54) INTEGRATED CIRCUIT PACKAGING SYSTEM WITH CONNECTION SUPPORTS AND METHOD OF MANUFACTURE THEREOF

(75) Inventors: Zigmund Ramirez Camacho, Singapore (SG); Emmanuel Espiritu, Singapore (SG); Henry Descalzo Bathan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 186 days.

(21) Appl. No.: 12/957,361

(22) Filed: Nov. 30, 2010

(65) Prior Publication Data

US 2012/0133036 A1  May 31, 2012

(51) Int. Cl.
 *H01L 23/495* (2006.01)
 *H01L 23/02* (2006.01)
 *H01L 23/48* (2006.01)
 *H01L 23/28* (2006.01)
 *H01L 23/52* (2006.01)

(52) U.S. Cl.
 USPC ............ 257/676; 257/678; 257/787; 257/734

(58) Field of Classification Search
 USPC ................. 257/666, 676, 678, 687, 787, 739, 257/748, 690, 694, 734, 784, 781
 See application file for complete search history.

(56) References Cited

U.S. PATENT DOCUMENTS

| | | | |
|---|---|---|---|
| 5,847,445 A | | 12/1998 | Wark et al. |
| 6,313,519 B1 | | 11/2001 | Gainey et al. |
| 7,301,225 B2 | | 11/2007 | Wong et al. |
| 8,063,470 B1 | * | 11/2011 | Sirinorakul et al. .......... 257/666 |
| 2005/0218499 A1 | * | 10/2005 | Chang et al. .................. 257/690 |
| 2010/0311208 A1 | * | 12/2010 | Sirinorakul et al. .......... 438/113 |

* cited by examiner

*Primary Examiner* — Chuong A. Luu
(74) *Attorney, Agent, or Firm* — Ishimaru & Associates LLP (57) ABSTRACT

A method of manufacture of an integrated circuit packaging system includes: providing a connection structure having a component pad, an outer pad, and an inner pad, the inner pad between the component pad and the outer pad; forming a support structure between the inner pad and the outer pad; mounting an integrated circuit device over the component pad; attaching an interconnect to the integrated circuit device and the outer pad, the interconnect above the inner pad and supported by the support structure; and applying an encapsulation over the connection structure, the interconnect, and the integrated circuit device.

20 Claims, 5 Drawing Sheets

INTEGRATED CIRCUIT PACKAGING SYSTEM WITH CONNECTION SUPPORTS AND METHOD OF MANUFACTURE THEREOF

TECHNICAL FIELD

The present invention relates generally to an integrated circuit packaging system, and more particularly to a system with connection supports.

BACKGROUND ART

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Smaller packages need to be electrically connected with other parts and components. As the smaller packages with more circuits continue to get shrink in size, there is a greater need to produce the smaller packages at a reduced cost with increases in product yields and product reliability.

Thus, an increasing need remains to increase manufacturing throughput and the product reliability while reducing costs as a result of manufacturing scrap and rework of parts. It is also critical that the smaller packages are easily manufactured using automated packaging machinery. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a connection structure having a component pad, an outer pad, and an inner pad, the inner pad between the component pad and the outer pad; forming a support structure between the inner pad and the outer pad; mounting an integrated circuit device over the component pad; attaching an interconnect to the integrated circuit device and the outer pad, the interconnect above the inner pad and supported by the support structure; and applying an encapsulation over the connection structure, the interconnect, and the integrated circuit device.

The present invention provides an integrated circuit packaging system, including: a connection structure having a component pad, an outer pad, and an inner pad, the inner pad between the component pad and the outer pad; a support structure between the inner pad and the outer pad; an integrated circuit device over the component pad; an interconnect attached to the integrated circuit device and the outer pad, the interconnect above the inner pad and supported by the support structure; and an encapsulation over the connection structure, the interconnect, and the integrated circuit device.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
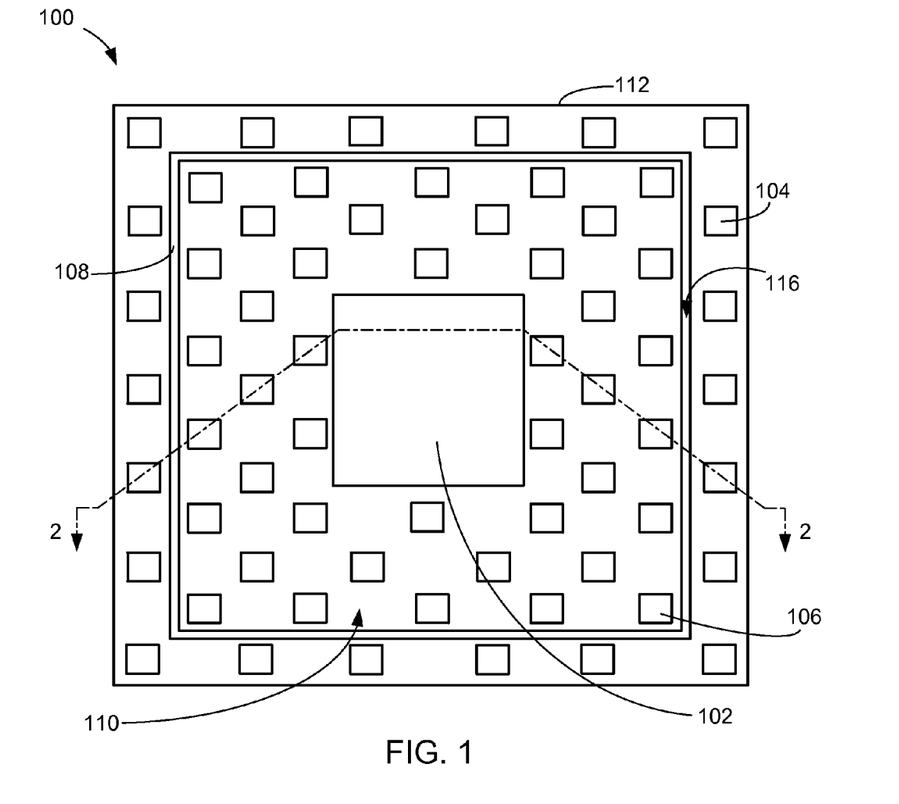
FIG. 1 is a bottom view of an integrated circuit packaging system in a first embodiment of the present invention.

Referring now to FIG. 1, therein is shown a bottom view of an integrated circuit packaging system 100 in a first embodiment of the present invention. The integrated circuit packaging system 100 includes a component pad 102, outer pads 104, inner pads 106, a support structure 108 or wire support, and a base side 110 of an encapsulation 112. The encapsulation 112 can be used to protect and hermetically seal the contents of the integrated circuit packaging system 100.

The component pad 102 is shown having a shape of a rectangle exposed from the base side 110 and can be formed of a chemical etchant resistant conductive plate-up material that can include nickel, palladium, or a combination thereof. The component pad 102 can optionally be used to provide electrical, structural, or thermal connectivity to a next level of integration that can include a printed circuit board, platform mount, heat sink, or a structural assembly.

A perimeter of the component pad 102 can be surrounded by the inner pads 106 formed of a chemical etchant resistant conductive plate-up material or of the material of the component pad 102. The inner pads 106 are exposed from the base side 110, separated from one another and from the component pad 102.

The outer pads 104 are exposed from the base side 110 and surround an outer perimeter area having all of the inner pads 106 formed of a chemical etchant resistant conductive plate-up material or of the material of the component pad 102. There is at least one of the inner pads 106 between the outer pads 104 and the component pad 102. The outer pads 104 are separated from one another, the inner pads 106, and the component pad 102 by the encapsulation 112.

The support structure 108 formed of an insulating material that can include a non-conductive B-stage adhesive layer, a polymer, a non-polymer, adhesive, or a non-adhesive material. The support structure 108 can be formed in an opening 116 of the encapsulation 112. The support structure 108 is formed between the outer pads 104 and the inner pads 106.

For purposes of illustration, the support structure 108 and the opening 116 are all shown around or surrounding the outer perimeter area having all of the inner pads 106. The support structure 108 does not need to be formed continuously in a support dam configuration. The support structure 108 can be formed to partially enclose the outer perimeter of the inner pads 106. For example, the support structure 108 can be formed having several sections around the outer perimeter of the inner pads 106 in a manner that results in gaps or spaces between the sections.

Figure 2:
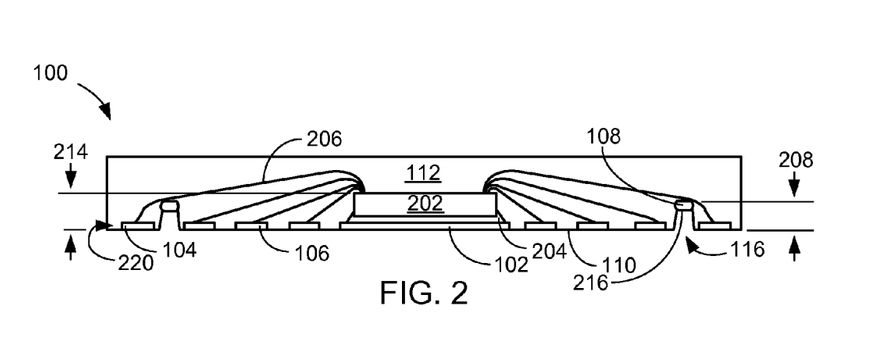
FIG. 2 is a cross-sectional view of FIG. 1 taken along line 2-2.

Referring now to FIG. 2, therein is shown a cross-sectional view of FIG. 1 taken along line 2-2. The integrated circuit packaging system 100 can include an integrated circuit device 202 mounted over the component pad 102 using an attachment layer 204. The attachment layer 204 can include an adhesive layer, a B-stage adhesive, or a B-stage epoxy. The attachment layer 204 includes an adhesive layer with sides obtuse to perimeter sides of the integrated circuit device 202.

Interconnects 206 can be used to connect circuitry of the integrated circuit device 202 with the inner pads 106 or the outer pads 104. The interconnects 206 can include bond wires or wires. The interconnects 206 connecting to the outer pads 104 are supported by the support structure 108. A section of the interconnects 206 supported by the support structure 108 can be on the support structure 108 or partially embedded in a portion of the support structure 108.

The support structure 108 is formed having a support height 208 less than a device height 214. The support height 208 is defined as a maximum vertical distance between the support structure 108 and the base side 110 of the encapsulation 112. The device height 214 is defined as a maximum vertical distance between the integrated circuit device 202 and the base side 110. The support height 208 can be equal to one-half of the device height 214, as an example.

An external end 216 of the support structure 108 opposite an end of the support structure 108 intersecting the interconnects 206 is exposed from the opening 116 of the encapsulation 112. The opening 116 can be formed by the encapsulation 112 and include have sides that are tapered or flared in shape exposing a portion of the support structure 108. The encapsulation 112 covers the integrated circuit device 202, the interconnects 206, the support structure 108, the component pad 102, the outer pads 104, and the inner pads 106.

Exposed sides of the component pad 102, the outer pads 104, and the inner pads 106 can be coplanar with the base side 110. The inner pads 106, the outer pads 104, and the component pad 102 are defined as a connection structure 220 of the present invention. The support structure 108 extends above the connection structure 220.

It has been discovered that the support structure 108 extending above all of the inner pads 106 and having the support height 208 less than the device height 214 eliminates connection failures of the interconnects 206. The connection failures include short or open failures that are the result of sweep, collapse, sag, or droop of the interconnects 206.

It has been discovered that the support structure 108 reduces heights of the interconnects 206 and overall height of the integrated circuit packaging system 100. The heights of the interconnects 206 is defined as a maximum vertical distance between the base side 110 and any point located on the interconnects 206. The support structure 108 enables the use of low profile wire bonding technologies.

Figure 3:
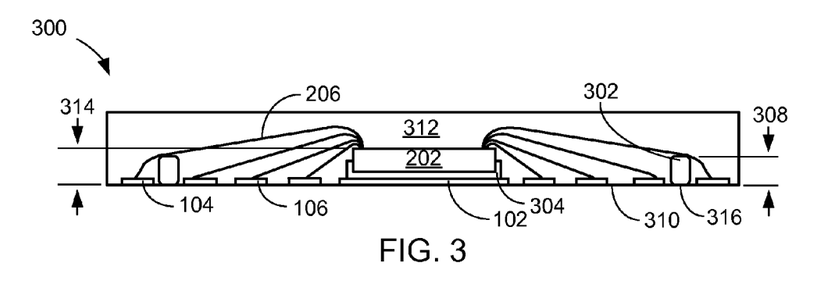
FIG. 3 is a cross-sectional view of an integrated circuit packaging system in a second embodiment of the present invention.

Referring now to FIG. 3, therein is shown a cross-sectional view of an integrated circuit packaging system 300 in a second embodiment of the present invention. The integrated circuit packaging system 300 can be similar to the integrated circuit packaging system 100 except the integrated circuit packaging system 300 includes a support structure 302 or wire support, an attachment layer 304, and a base side 310 of an encapsulation 312.

The support structure 302 formed of an insulating material that can include a non-conductive B-stage adhesive layer, a polymer, a non-polymer, adhesive, or a non-adhesive material. The integrated circuit packaging system 100 can include the integrated circuit device 202 mounted over the component pad 102 using the attachment layer 304.

The attachment layer 304 can include a B-stage epoxy, a B-stage adhesive, or an adhesive layer. The attachment layer 304 includes a B-stage epoxy with sides of the attachment layer 304 parallel to perimeter sides of the integrated circuit device 202 and covering at least a portion of the perimeter sides.

The interconnects 206 can be used to connect circuitry of the integrated circuit device 202 with the inner pads 106 or the outer pads 104. A section of the interconnects 206 connecting to the outer pads 104 are supported by the support structure 302. The interconnects 206 supported by the support structure 302 can be on the support structure 302 or partially embedded in a portion of the support structure 302.

For purposes of illustration, the support structure 302 can enclose an outer perimeter area having all of the inner pads 106. The support structure 302 does not need to be formed continuously in a support dam configuration. The support structure 302 can be formed to partially enclose the outer perimeter of the inner pads 106. For example, the support structure 302 can be formed having several sections around the outer perimeter of the inner pads 106 in a manner that results in gaps or spaces between the sections.

The support structure 302 is formed having a support height 308 less than a device height 314. The support height 308 is defined as a maximum vertical distance between the support structure 302 and the base side 310 of the encapsulation 312. The device height 314 is defined as a maximum vertical distance between the integrated circuit device 202 and the base side 310. The support height 308 can be equal to one-half of the device height 314, as an example.

An external end 316 of the support structure 302 opposite an end of the support structure 302 intersecting the interconnects 206 is exposed from and coplanar with the base side 310 of the encapsulation 312. The encapsulation 312 covers the integrated circuit device 202, the interconnects 206, the support structure 302, the component pad 102, the outer pads 104, and the inner pads 106. Exposed sides of the component pad 102, the outer pads 104, and the inner pads 106 can be coplanar with the base side 310.

It has been discovered that the support structure 302 extending above all of the inner pads 106 and having the support height 308 less than the device height 314 eliminates connection failures of the interconnects 206. The connection failures include short or open failures that are the result of sweep, collapse, sag, or droop of the interconnects 206.

It has been discovered that the support structure 302 reduces heights of the interconnects 206 and overall height of the integrated circuit packaging system 300. The heights of the interconnects 206 is defined as a maximum vertical distance between the base side 310 and any point located on the interconnects 206. The support structure 302 enables the use of low profile wire bonding technologies.

Figure 4:
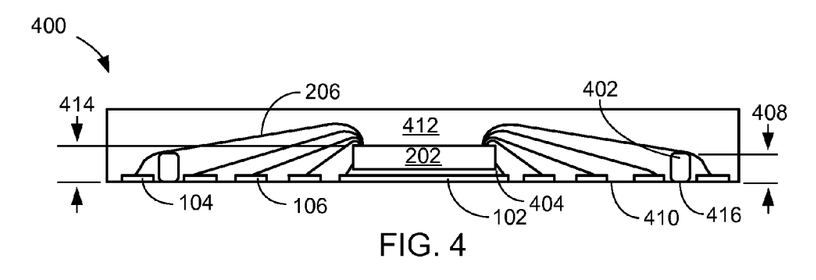
FIG. 4 is a cross-sectional view of an integrated circuit packaging system in a third embodiment of the present invention.

Referring now to FIG. 4, therein is shown a cross-sectional view of an integrated circuit packaging system 400 in a third embodiment of the present invention. The integrated circuit packaging system 400 can be similar to the integrated circuit packaging system 100 except the integrated circuit packaging system 400 includes a support structure 402 or wire support, an attachment layer 404, and a base side 410 of an encapsulation 412.

The support structure 402 formed of an insulating material that can include a non-conductive B-stage adhesive layer, a polymer, a non-polymer, adhesive, or a non-adhesive material. The integrated circuit packaging system 100 can include the integrated circuit device 202 mounted over the component pad 102 using the attachment layer 404. The attachment layer 404 can include an adhesive layer, a B-stage adhesive, or B-stage epoxy. The attachment layer 404 includes an adhesive layer with sides obtuse to perimeter sides of the integrated circuit device 202.

The interconnects 206 can be used to connect circuitry of the integrated circuit device 202 with the inner pads 106 or the outer pads 104. A section of the interconnects 206 connecting to the outer pads 104 are supported by the support structure 402. The interconnects 206 supported by the support structure 402 can be on the support structure 402 or partially embedded in a portion of the support structure 402.

For purposes of illustration, the support structure 402 can enclose an outer perimeter area having all of the inner pads 106. The support structure 402 does not need to be formed continuously in a support dam configuration. The support structure 402 can be formed to partially enclose the outer perimeter of the inner pads 106. For example, the support structure 402 can be formed having several sections around the outer perimeter of the inner pads 106 in a manner that results in gaps or spaces between the sections.

The support structure 402 is formed having a support height 408 less than a device height 414. The support height 408 is defined as a maximum vertical distance between the support structure 402 and the base side 410 of the encapsulation 412. The device height 414 is defined as a maximum vertical distance between the integrated circuit device 202 and the base side 410. The support height 408 can be equal to one-half of the device height 414, as an example.

An external end 416 of the support structure 402 opposite an end of the support structure 402 intersecting the interconnects 206 is exposed from and coplanar with the base side 410 of the encapsulation 412. The encapsulation 412 covers the integrated circuit device 202, the interconnects 206, the support structure 402, the component pad 102, the outer pads 104, and the inner pads 106. Exposed sides of the component pad 102, the outer pads 104, and the inner pads 106 can be coplanar with the base side 410.

It has been discovered that the support structure 402 extending above all of the inner pads 106 and having the support height 408 less than the device height 414 eliminates connection failures of the interconnects 206. The connection failures include short or open failures that are the result of sweep, collapse, sag, or droop of the interconnects 206.

It has been discovered that the support structure 402 reduces heights of the interconnects 206 and overall height of the integrated circuit packaging system 400. The heights of the interconnects 206 is defined as a maximum vertical distance between the base side 410 and any point located on the interconnects 206. The support structure 402 enables the use of low profile wire bonding technologies.

Figure 5:
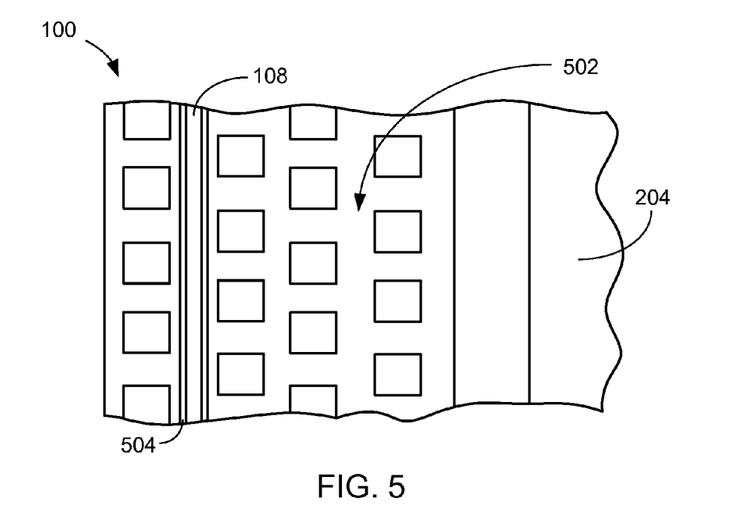
FIG. 5 is a top plan view of the integrated circuit packaging system of FIG. 1 in a die attach phase of manufacture.

Referring now to FIG. 5, therein is shown a top plan view of the integrated circuit packaging system 100 of FIG. 1 attach phase of manufacture. Shown is a portion of a leadframe 502 or copper based leadframe during the die attach phase of the die attach process. Protrusion 504 or wire support copper protrusion of the leadframe 502 can be covered with material using an epoxy printing process to form the support structure 108 while the attachment layer 204 is applied on to the component pad 102 using a die attach dispenser or screen print process.

It has been discovered that the application and formation of the support structure 108 can occur in conjunction with the application of the attachment layer 204 resulting in significant increase in manufacturing throughput while decreasing manufacturing process steps.

Figure 6:
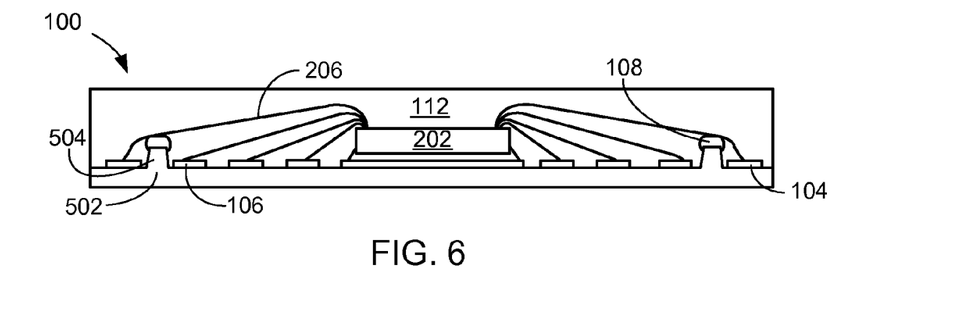
FIG. 6 is a cross-sectional view of FIG. 2 in an encapsulation phase of manufacture.

Referring now to FIG. 6, therein is shown a cross-sectional view of FIG. 2 in an encapsulation phase of manufacture. The support structure 108 is shown over the protrusion 504 of the leadframe 502 between any of the outer pads 104 and all of the inner pads 106. The interconnects 206 connecting the integrated circuit device 202 with the outer pads 104 can be routed over the interconnects 206 attached to the inner pads 106 and on to the support structure 108.

The support structure 108 can be B-staged before or after the attachment of the interconnects 206 using a heat or ultraviolet irradiation during a B-staging process. Furthermore, the support structure 108 can be subjected to a heating process to cure the material of the support structure 108 before or after application of the encapsulation 112.

It has been discovered that the combination of the support structure 108 with a B-stage material and the B-staging process relative to the attachment of the interconnects 206 permeably supports the interconnects 206 to increase the mean time before failure (MTBF) of the interconnects 206. The discovery of the support structure 108 combined with the B-stage processing minimizes strain, tension, or compressive forces applied to the interconnects 206.

It has also been discovered that the curing of the support structure 108 intersecting the interconnects 206 relative to the application of the encapsulation 112 can improve the product yield.

Figure 7:
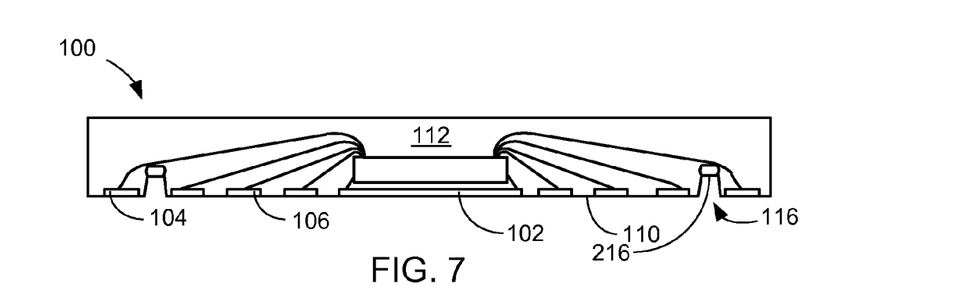
FIG. 7 is the cross-sectional view of FIG. 6 in a base etching phase.

Referring now to FIG. 7, therein is shown the cross-sectional view of FIG. 6 in a base etching phase. The leadframe 502 of FIG. 6 and the protrusion 504 of FIG. 6 can be removed during the base etching phase using a removal process to form the integrated circuit packaging system 100 of FIG. 2. The removal phase can include an etching process, a cleaning process, or a drying process to expose the component pad 102, the outer pads 104, the inner pads 106, the base side 110 of the encapsulation 112, the opening 116 of the encapsulation 112, and the external end 216.

Figure 8:
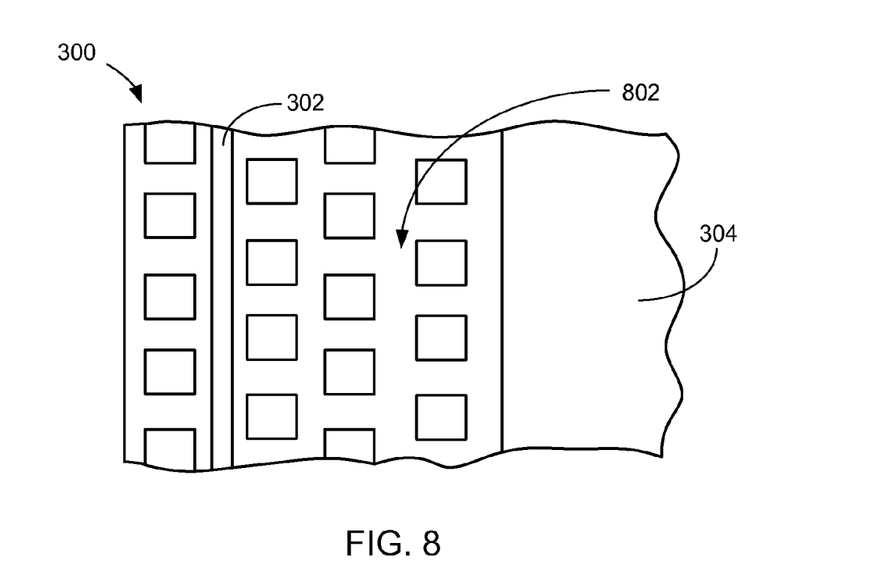
FIG. 8 is a top plan view of the integrated circuit packaging system of FIG. 3 in a die attach phase of manufacture.

Referring now to FIG. 8, therein is shown a top plan view of the integrated circuit packaging system 300 of FIG. 3 in a die attach phase of manufacture. Shown is a portion of a leadframe 802 or copper based leadframe during the die attach phase of the die attach process. The material used to form the support structure 302 can be applied using an epoxy printing process while the attachment layer 304 is applied on to the component pad 102 using a die attach dispenser or screen print process.

It has been discovered that the application and formation of the support structure 302 can occur in conjunction with the application of the attachment layer 304 resulting in significant increase in manufacturing throughput while decreasing manufacturing process steps.

Figure 9:
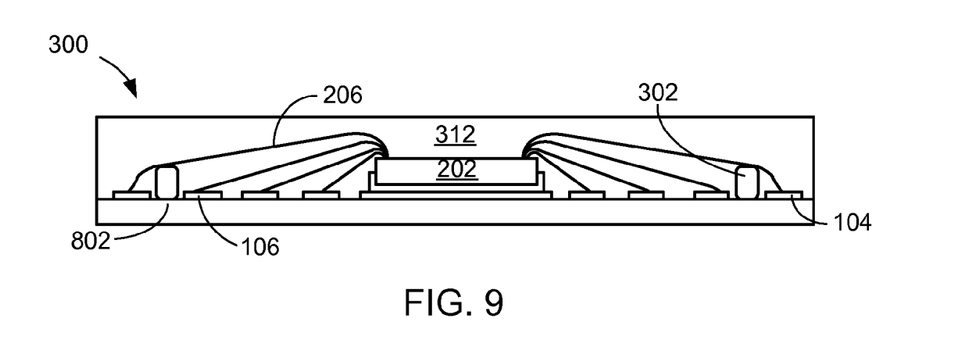
FIG. 9 is a cross-sectional view of the FIG. 3 in an encapsulation phase of manufacture.

Referring now to FIG. 9, therein is shown a cross-sectional view of the FIG. 3 in an encapsulation phase of manufacture. The support structure 302 is shown formed on the leadframe 802 between any of the outer pads 104 and all of the inner pads 106. The interconnects 206 connecting the integrated circuit device 202 with the outer pads 104 can be routed over the interconnects 206 attached to the inner pads 106 and on to the support structure 302.

The support structure 302 can be B-staged before or after the attachment of the interconnects 206 using a heat or ultraviolet irradiation process. Furthermore, the support structure 302 can be subjected to a heating process to cure the material of the support structure 302 before or after application of the encapsulation 312.

It has been discovered that the combination of the support structure 302 with a B-stage material and the B-staging process relative to the attachment of the interconnects 206 permeably supports the interconnects 206 to increase the mean time before failure (MTBF) of the interconnects 206. The discovery of the support structure 302 combined with the B-stage processing minimizes strain, tension, or compressive forces applied to the interconnects 206.

It has also been discovered that the curing of the support structure 302 intersecting the interconnects 206 relative to the application of the encapsulation 312 can improve the product yield.

Figure 10:
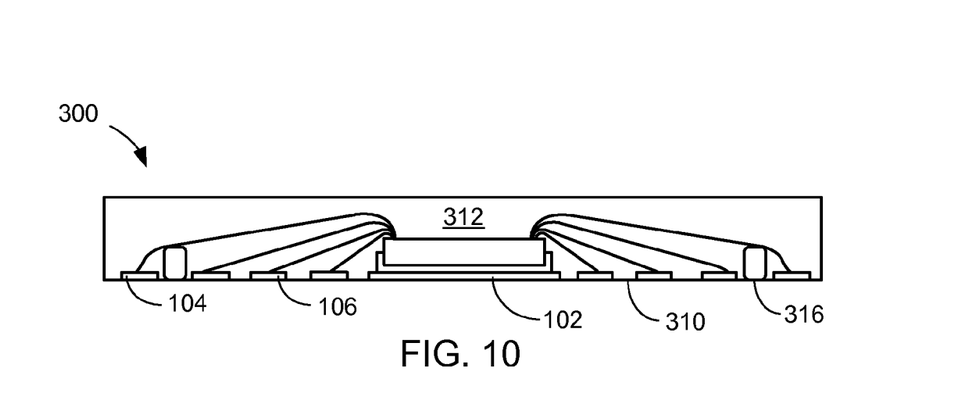
FIG. 10 is the cross-sectional view of FIG. 9 in a base etching phase.

Referring now to FIG. 10, therein is shown the cross-sectional view of FIG. 9 in a base etching phase. The leadframe 802 of FIG. 9 can be removed during the base etching phase using a removal process to form the integrated circuit packaging system 300 of FIG. 3. The removal phase can include an etching process, a cleaning process, or a drying process to expose the component pad 102, the outer pads 104, the inner pads 106, the base side 310 of the encapsulation 312, and the external end 316.

Figure 11:
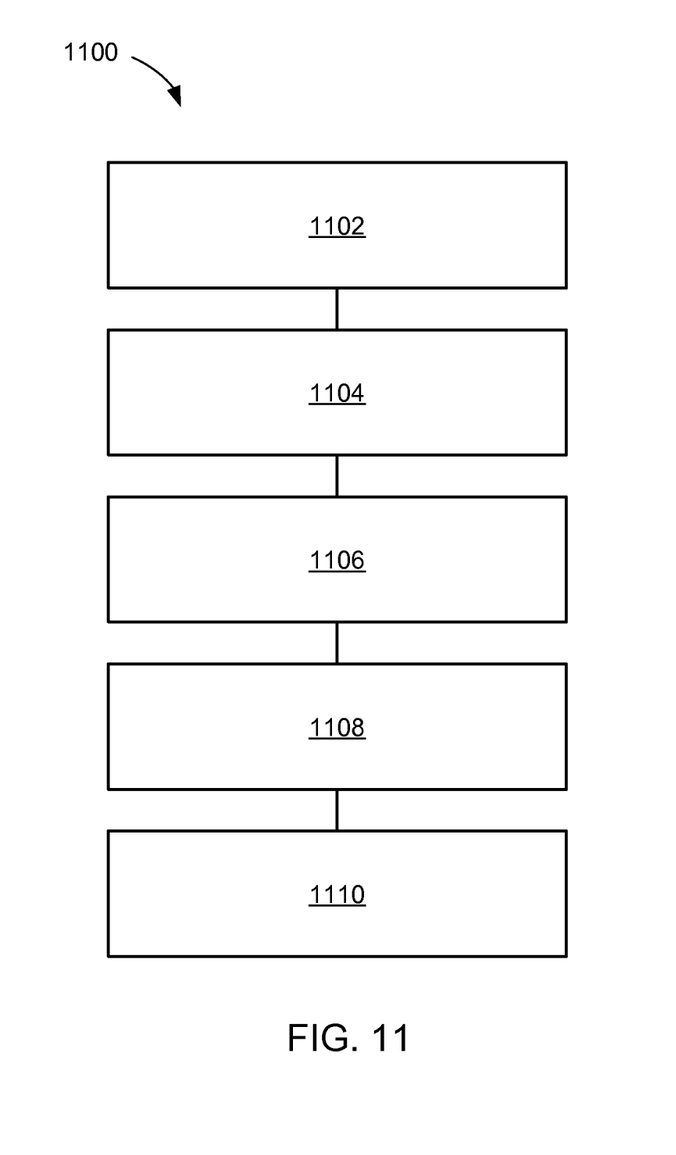
FIG. 11 is a flow chart of a method of manufacture of the integrated circuit packaging system in a further embodiment of the present invention.

Referring now to FIG. 11, therein is shown a flow chart of a method 1100 of manufacture of the integrated circuit packaging system 100 in a further embodiment of the present invention. The method 1100 includes: providing a connection structure having a component pad, an outer pad, and an inner pad, the inner pad between the component pad and the outer pad in a block 1102; forming a support structure between the inner pad and the outer pad in a block 1104; mounting an integrated circuit device over the component pad in a block 1106; attaching an interconnect to the integrated circuit device and the outer pad, the interconnect above the inner pad and supported by the support structure in a block 1108; and applying an encapsulation over the connection structure, the interconnect, and the integrated circuit device in a block 1110.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a connection structure having a component pad, an outer pad, and an inner pad, the inner pad between the component pad and the outer pad;
   forming a support structure between the inner pad and the outer pad;
   mounting an integrated circuit device over the component pad;
   attaching an interconnect to the integrated circuit device and the outer pad, the interconnect is a continuos and above the inner pad and supported by the support structure; and
   applying an encapsulation over the connection structure, the interconnect, and the integrated circuit device.

2. The method as claimed in claim 1 wherein forming the support structure includes forming the support structure to extend above the connection structure.

3. The method as claimed in claim 1 wherein attaching the interconnect includes partially embedding a portion of the interconnect in the support structure.

4. The method as claimed in claim 1 further comprising forming an opening in the encapsulation, the support structure partially exposed in the opening.

5. The method as claimed in claim 1 wherein mounting the integrated circuit device includes attaching an attachment layer between the integrated circuit device and the component pad.

6. A method of manufacture of an integrated circuit packaging system comprising:
   providing a connection structure having a component pad, an outer pad, and an inner pad, the inner pad between the component pad and the outer pad;
   forming a support structure between the inner pad and the outer pad;
   mounting an integrated circuit device over the component pad;
   attaching a first interconnect is a continuous and to the integrated circuit device and the outer pad, the first interconnect is a continuos and above the inner pad and supported by the support structure;
   attaching a second interconnect to the integrated circuit device and the inner pad; and
   applying an encapsulation over the connection structure, the first interconnect, the second interconnect, and the integrated circuit device.

7. The method as claimed in claim 6 wherein forming the support structure includes forming an external end of the support structure exposed and coplanar with a base side of the encapsulation.

8. The method as claimed in claim 6 wherein attaching the first interconnect includes partially embedding the first interconnect in a non-conductive B-stage adhesive layer.

9. The method as claimed in claim 6 further comprising forming an opening in the encapsulation, the opening having sides that are flared in shape to expose a portion of the support structure.

10. The method as claimed in claim 6 wherein mounting the integrated circuit device includes attaching an attachment layer between the integrated circuit device and the component pad with sides of the attachment layer parallel to perimeter sides of the integrated circuit device.

11. An integrated circuit packaging system comprising:
    a connection structure having a component pad, an outer pad, and an inner pad, the inner pad between the component pad and the outer pad;
    a support structure between the inner pad and the outer pad;
    an integrated circuit device over the component pad;
    an interconnect is a continuous and attached to the integrated circuit device and the outer pad, the interconnect above the inner pad and supported by the support structure; and
    an encapsulation over the connection structure, the interconnect, and the integrated circuit device.

12. The system as claimed in claim 11 wherein the support structure includes the support structure extended above the connection structure.

13. The system as claimed in claim 11 wherein the interconnect includes a portion of the interconnect partially embedded in the support structure.

14. The system as claimed in claim 11 further comprising an opening in the encapsulation, the support structure partially exposed in the opening.

15. The system as claimed in claim 11 wherein the integrated circuit device includes an attachment layer between the integrated circuit device and the component pad.

16. The system as claimed in claim 11 further comprising a second interconnect attached to the integrated circuit device and the inner pad.

17. The system as claimed in claim 16 wherein the support structure includes an external end of the support structure exposed and coplanar with a base side of the encapsulation.

18. The system as claimed in claim 16 wherein the interconnect includes the first interconnect partially embedded in a non-conductive B-stage adhesive layer.

19. The system as claimed in claim 16 wherein the encapsulation has an opening, the opening having sides that are flared in shape to expose a portion of the support structure.

20. The system as claimed in claim 16 wherein the integrated circuit device includes an attachment layer between the integrated circuit device and the component pad with sides of the attachment layer parallel to perimeter sides of the integrated circuit device.

* * * * *

UNITED STATES PATENT AND TRADEMARK OFFICE
CERTIFICATE OF CORRECTION

| | |
|---|---|
| PATENT NO. | : 8,508,026 B2 |
| APPLICATION NO. | : 12/957361 |
| DATED | : August 13, 2013 |
| INVENTOR(S) | : Camacho et al. |

Page 1 of 1

It is certified that error appears in the above-identified patent and that said Letters Patent is hereby corrected as shown below:

In the Claims:

1. Column 9, Claim 1, line 14, delete "is a continuos" and insert therefor --is continuous--

2. Column 9, Claim 6, line 42, after "a first interconnect" delete "is a continuos and"

3. Column 9, Claim 6, line 44, delete "is a continuos" and insert therefor --is continuous--

4. Column 10, Claim 11, line 18, delete "is a continuous" and insert therefor --is continuous--

Signed and Sealed this
First Day of December, 2015

Michelle K. Lee
*Director of the United States Patent and Trademark Office*